US006515367B1

(12) United States Patent
Bernard et al.

(10) Patent No.: US 6,515,367 B1
(45) Date of Patent: Feb. 4, 2003

(54) SUB-CAP AND METHOD OF MANUFACTURE THEREFOR IN INTEGRATED CIRCUIT CAPPING LAYERS

(75) Inventors: Joffre F. Bernard, Redwood City, CA (US); Minh Van Ngo, Fremont, CA (US); Tim Z. Hossain, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/123,701

(22) Filed: Apr. 15, 2002

Related U.S. Application Data

(63) Continuation of application No. 09/677,710, filed on Sep. 30, 2000.

(51) Int. Cl.[7] ........................ H01L 23/48; H01L 23/52; H01L 29/40

(52) U.S. Cl. ....................... 257/758; 257/751; 438/653; 438/645

(58) Field of Search ................................ 257/758, 751, 257/767, 622, 626; 438/700, 702

(56) References Cited

U.S. PATENT DOCUMENTS 6,083,835 A * 7/2000 Shue et al.
6,100,184 A * 8/2000 Zhao et al.
6,114,243 A * 9/2000 Gupta et al.
6,130,161 A * 10/2000 Ashley et al.
6,157,081 A * 12/2000 Nariman et al.
6,159,845 A * 12/2000 Yew et al.
6,258,713 B1 * 7/2001 Yu et al.
6,261,950 B1 * 7/2001 Tobben et al.
6,274,499 B1 * 8/2001 Gupta et al.
6,281,127 B1 * 8/2001 Shue
6,288,448 B1 * 9/2001 Pramanick
6,323,135 B1 * 11/2001 Ngo et al.
6,350,678 B1 * 2/2002 Pramanick et al.

* cited by examiner

*Primary Examiner*—Sheila V. Clark
(74) *Attorney, Agent, or Firm*—Mikio Ishimaru

(57) ABSTRACT

An integrated circuit and manufacturing method therefor is provided having a semiconductor substrate with a semiconductor device. A device dielectric layer is formed on the semiconductor substrate, and a channel dielectric layer formed on the device dielectric layer has an opening formed therein. A barrier layer lines the channel opening, and a conductor core fills the opening over the barrier layer. Self-aligned sub-caps of silicide and/or oxides are formed over the conductor core and then capped by a capping layer which covers the sub-caps and the channel dielectric layer.

14 Claims, 3 Drawing Sheets

SUB-CAP AND METHOD OF MANUFACTURE THEREFOR IN INTEGRATED CIRCUIT CAPPING LAYERS

CROSS-REFERENCE TO RELATED APPLICATION

This is a continuation of co-pending application Ser. No. 09/677,710 filed Sep. 30, 2000.

TECHNICAL FIELD

The present invention relates generally to semiconductor technology and more specifically to an improvement in capping layers in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings. The seed layer, generally of copper, is deposited to act as an electrode for the electroplating process.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and the "single" damascene process is completed. When additional layers of material are to be deposited for the dual damascene process, the capping layer also functions as an etch stop layer for a via formation step.

The via formation step of the dual damascene process continues with the deposition of a via dielectric layer over the first channels, the first channel dielectric layer, and the capping or via stop layer. The via stop layer is an etch stop layer which is subject to photolithographic processing arid anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second, channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, which are deposited by electroplating, a seed layer is deposited by electro-less deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to simultaneously form the vias and the second channels. When a layer is placed over the second channels as a final layer, it is called a "capping" layer and the "dual" damascene process is completed.

Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

One major problem that has been discovered with highly diffusive materials such as copper is that the capping layer, generally of silicon nitride, is subject to a time-dependent dielectric breakdown in which electromigration of copper occurs over the life of the semiconductor device and causes line-to-line leakage.

Solutions to this problem have been long sought but have long eluded those skilled in the art.

DISCLOSURE OF THE INVENTION

The present invention provides an integrated circuit having a semiconductor substrate with a semiconductor device. A dielectric layer is on the semiconductor substrate and has an opening provided therein. A barrier layer lines the opening, and a conductor core fills the opening over the barrier layer. Self-aligned sub-caps of silicide and/or oxides are formed over the conductor core and then capped by a layer which covers the sub-caps and the channel dielectric layer. The sub-caps reduce electromigration and line-to-line leakage in conductor core interconnect structures.

The present invention further provides a method for manufacturing an integrated circuit having a semiconductor substrate with a semiconductor device. A dielectric layer is formed on the semiconductor substrate and an opening is formed in the dielectric layer. A barrier layer is deposited to line the opening and conductor core is deposited to fill the channel opening over the barrier layer. Self-aligned sub-caps of silicide and/or oxides are formed over the conductor core and then capped by a layer which covers the sub-caps and the channel dielectric layer. The silane ($SiH_4$) plasma and/or the ammonia ($NH_3$) plasma processes provide improved electromigration resistance and reduction of line-to-line leakage in conductor core interconnect structures.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
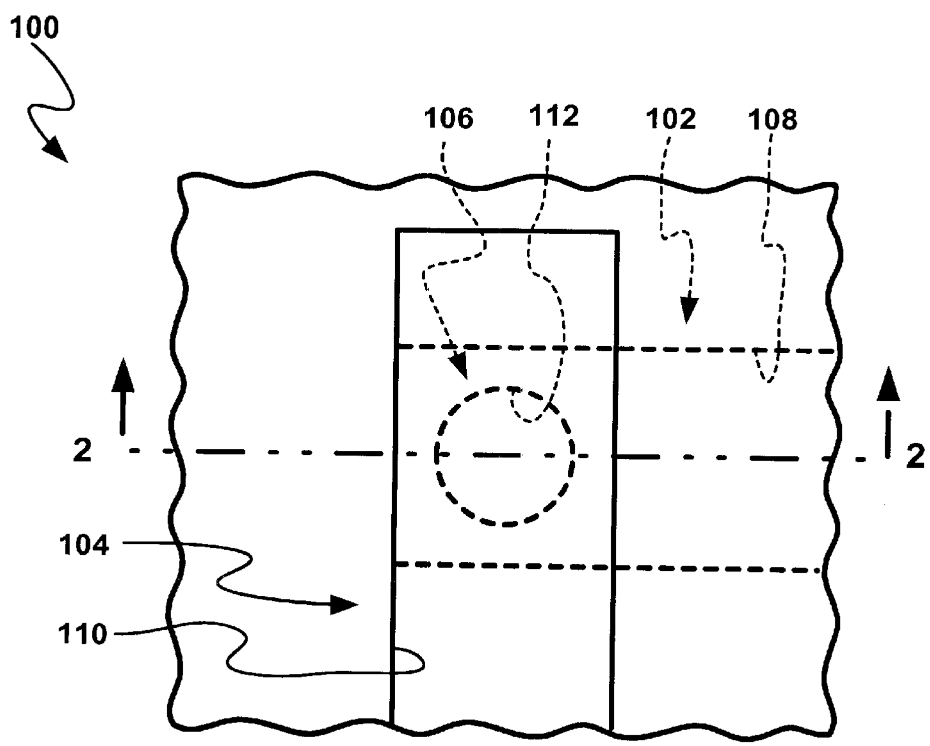
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
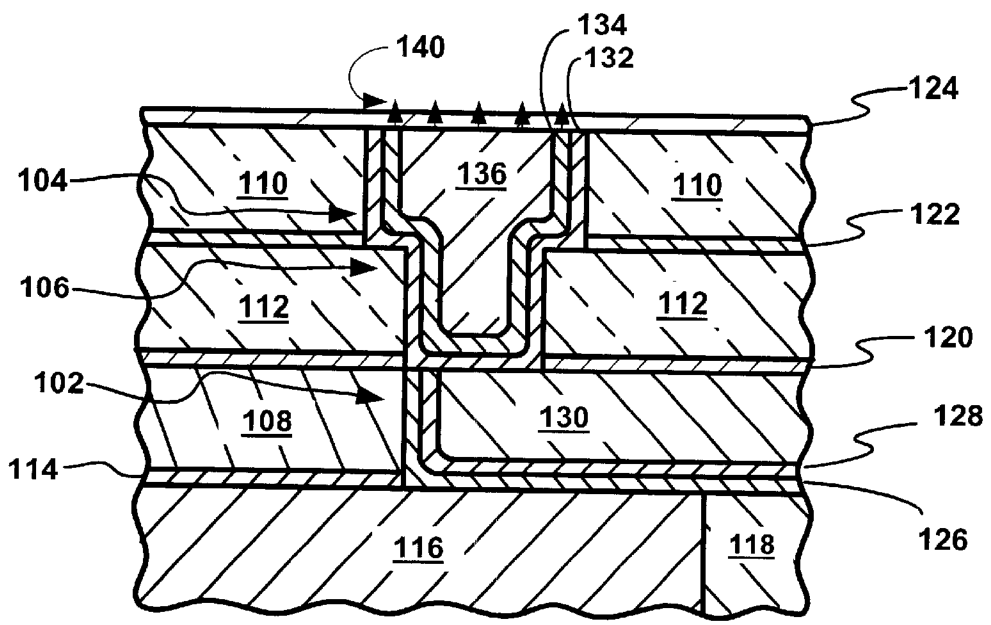
FIG. 2 (PRIOR ART) is a cross-section of FIG. 1 along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes upon which the conductor material of the conductor cores 130 and 136 are deposited. The seed layers 128 and 134 are of substantially the same conductor material as the conductor cores 130 and 136 and become part of the respective conductor cores 130 and 136 after the deposition.

The deposition of the barrier layer 132 is such that it fills the bottom of the via 106 at barrier layer portion 138 so as to effectively separate the conductor cores 130 and 136.

Where the capping layer 124 is directly on the seed layer 134 and the conductor core 136, there will be electromigration 140 through the capping layer 124 with highly diffusive materials such as copper. The capping layer, generally of silicon nitride, is subject to a time-dependent dielectric breakdown in which electromigration of copper occurs over the life of the semiconductor device and causes line-to-line leakage.

Figure 3:
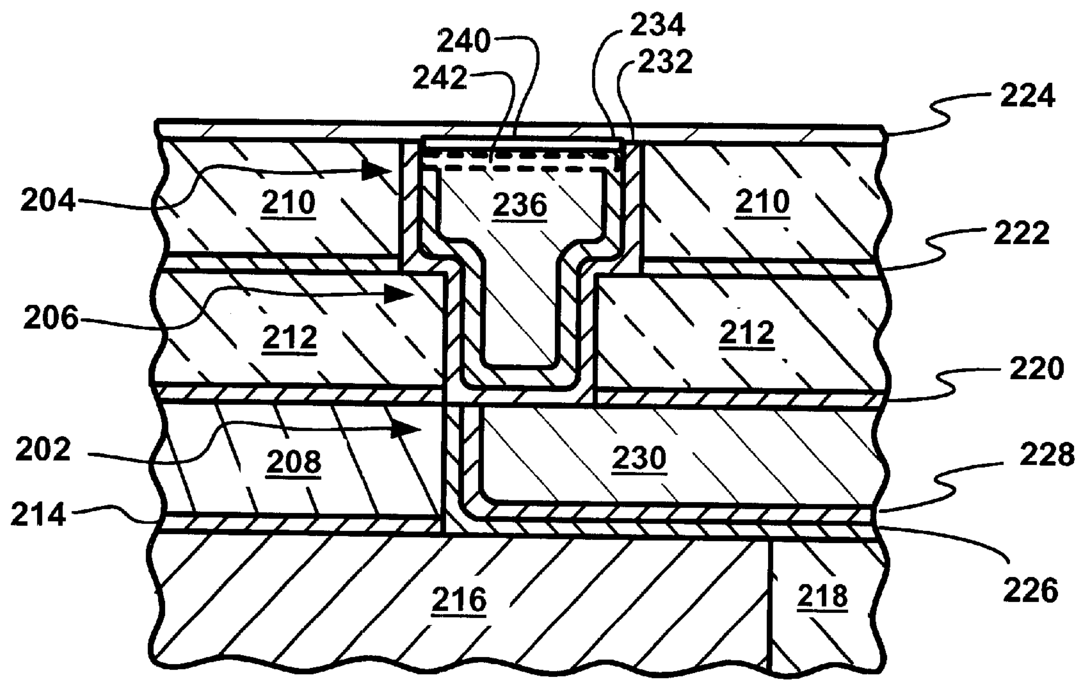
FIG. 3 is a cross-section similar to FIG. 2 (PRIOR ART) showing the sub-cap of the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a capping layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 are deposited. The seed layers 228 and 234 are of substantially the same conductor material as the conductor cores 230 and 236 and become part of the respective conductor cores 230 and 236 after the deposition.

The capping layer 224 in the FIG. 3 embodiment is disposed over a sub-cap 240, which for a copper conductor core is of a material such as copper silicide (CuSi). Also shown in dotted lines is a sub-cap 242, which may be of a copper oxide (CuO). Either or both of the sub-caps 240 and 242 significantly reduces electromigration through the capping layer 224.

Figure 4:
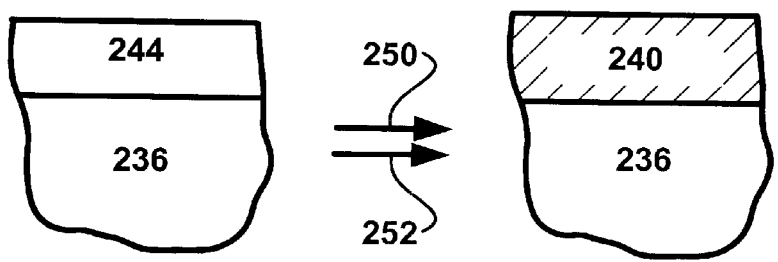
FIG. 4 is a close up cross-section of a step in forming the sub-cap of the present invention.

Referring now to FIG. 4, therein is shown a close up cross-section of the conductor core 236 having residual oxides 244 remaining on the conductor core 236 as a result of the chemical-mechanical polishing (CMP) process used to planarize the conductor core 236. By using a silane ($SiH_4$) plasma process 250, the hydrogen (H) in the silane, due to its hydrogen content, reduces the copper oxide and the silicon (Si) bonds with the conductor core 236 to form a self-aligned conductor core silicide, which in the case of copper is of copper silicide. No silicide will form where there is no copper so the second channel dielectric layer 210 will not have a silicide formed on it. Thus, the siliciding process is self-aligning.

In an alternate process, the conductor core 236 can be pretreated with an ammonia ($NH_3$) plasma process 252 to reduce the post-CMP oxide and silane used to form the silicide.

Figure 5:
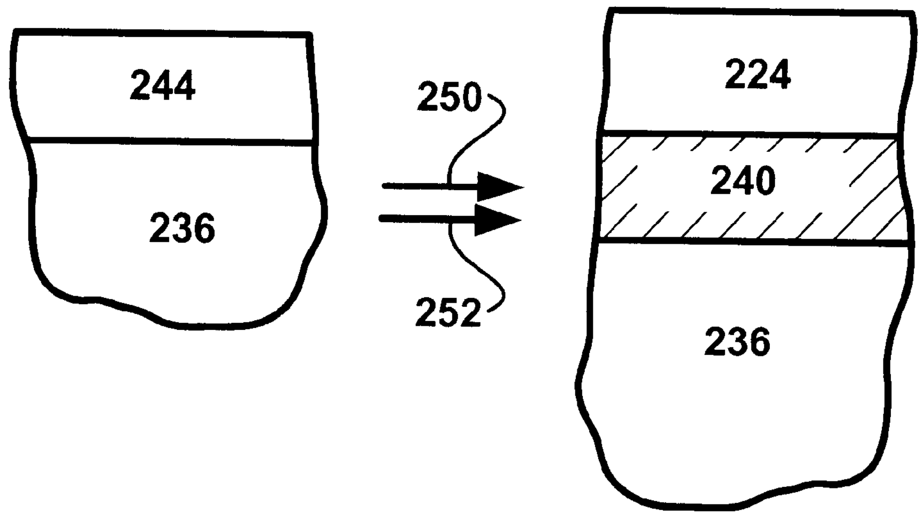
FIG. 5 is a close up cross-section of one embodiment of the present invention.

Referring now to FIG. 5, therein is shown the structure of FIG. 4 having the capping layer 224 deposited thereon. For a copper conductor core, with a sub-cap 240 of copper silicide, the capping layer 224 will be of silicon nitride (SiN).

Figure 6:
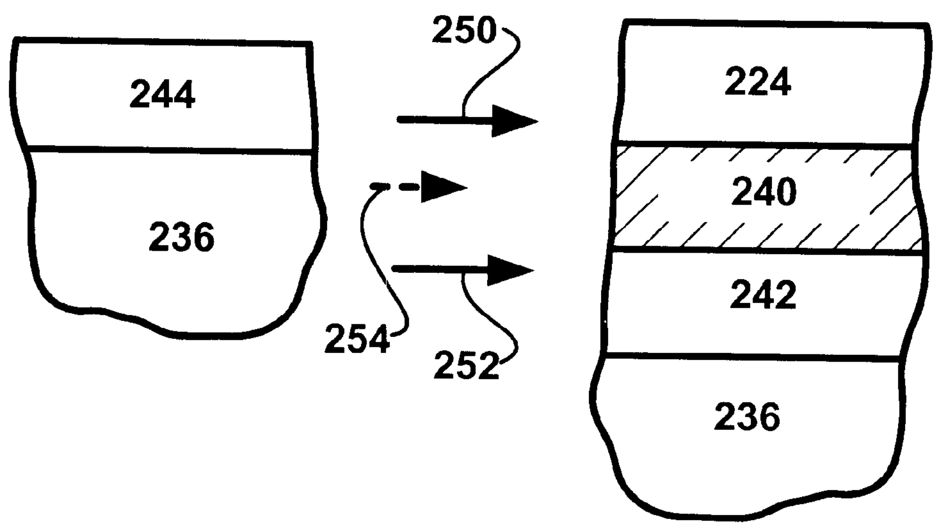
FIG. 6 is a close up cross-section of an alternate embodiment of the present invention.

Referring now to FIG. 6, therein is shown an alternate embodiment which can again use either the silane plasma process 250 or the ammonia and silane plasma process 252. After either full or partial reduction of the residual oxide 244, the conductor core 236 is reoxidized in a reoxidation process 254 to build up an additional oxide layer such as the sub-cap 242, which would be of a material such as copper oxide. This oxide-growth thickness can be controlled to provide an additional sub-cap.

With either or both of the sub-caps 240 and 242, the resulting interface between the conductor core 236 and the capping layer 224 will greatly reduce the mobility of copper atoms.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hither-to-fore set forth or shown in the accompanying drawings are to be interpreted in an illustrative and non-limiting sense.

The invention claimed is:

1. An integrated circuit comprising:

a semiconductor substrate having a semiconductor device provided thereon;

a dielectric layer on the semiconductor substrate and having an opening provided therein;

a barrier layer lining the opening;

a conductor core over the barrier layer, the conductor core filling the opening and connected to the semiconductor device;

two sub-caps self-aligned over the conductor core and formed into electromigration reducing compounds with the conductor core; and a capping layer over the sub-cap and the dielectric layer.

2. The integrated circuit as claimed in claim 1 wherein the sub-caps include a silicide layer over the conductor core.

3. The integrated circuit as claimed in claim 1 including a quality oxide on the conductor core.

4. The integrated circuit as claimed in claim 1 wherein the capping layer includes a nitride layer over the conductor core.

5. The integrated circuit as claimed in claim 1 wherein the conductor core is a metal selected from a group consisting of copper, copper-base alloys, aluminum, gold, gold-base alloys, silver, silver-base alloys, and a combination thereof.

6. An integrated circuit comprising:

a silicon substrate having a semiconductor device provided thereon;

a device oxide layer on the semiconductor substrate and having a channel opening provided therein;

a barier layer lining the channel opening of a material selected from a group consisting of tantalum, titanium, tungsten, the nitrides thereof, and combinations thereof;

a seed layer linig the metal barrier layer of a material selected from a group consisting of copper, copper-base alloys, aluminum, gold, gold-base alloys, silver, silver-base alloys, and a combintion thereof;

a conductor core of a material selected from a group consisting of copper, copper-base alloys, aluminum, gold, gold-base alloys, silver, silver-base alloys, and a combination thereof filling the channel opening and connected to the semiconductor device;

a first sub-cap self-aligned over the conductor core of a silicide and formed into an electromigration reducing silicide compound with the conductor core;

a second sub-cap self-aligned over the conductor core of an oxide and formed into an electromigration reducing oxide compound with the conductor core; and a capping layer of a nitride over the first and second sub-caps and the dielectric layer.

7. The integrated circuit as claimed in claim 6 wherein the sub-caps include a quality oxide on the conductor core.

8. The integrated circuit as claimed in claim 6 wherein the capping layer includes a silicon nitride layer over the conductor core.

9. A method of manufacturing an integratd circuit comprising the steps of:

providing a semiconductor substrate having a semiconductor device provided thereon;

forming a dielectric layer on the smiconductor substrate;

forming a opening in the dielectric layer;

depositing a barier layer to line the opening;

depositing a conductor core over the barrier layer to fill the opening and connect to the semiconductor device;

planarizing the conductor core and the barrier layer to be co-planar with the dielectric layer;

forming a first sub-cap self-aligned over the conductor core and forming a first electromigration reducing compound with the conductor core;

forming a second sub-cap self-aligned over the first sub-cap and forming a second electromigration reducing compound with the conductor core; and depositing a capping layer over the sub-caps and the dielectric layer.

10. The method of manufactuing an integrated circuit as claimed in claim 9 wherein the step of forming one of the two sub-caps includes forming an electromigration reducing silicide layer over the conductor core.

11. The method of manufacturing an integrated circuit as claimed in claim 9 wherein the step of planarizing the conductor core leaves residual oxides thereon; and including a step of reducing the residual oxides on the conductor core.

12. The method of manufacturing an integrated circuit as claimed in claim 9 wherein the step of planarizing the conductor core leaves residual oxides thereon; including a step of reducing the residual oxides on the conductor core; and including a step of forming a quality oxide on the conductor core.

13. The method of manufacturing an integrated circuit as claimed in claim 9 wherein the step of forming the capping layer includes forming a nitride layer over the conductor core.

14. The method of manufacturing an integrated circuit as claimed in claim 9 wherein the step of depositing the conductor core deposits a metal selected from a group consisting of copper, copper-base alloys, aluminum, gold, gold-base alloys, silver, silver-base alloys, and a combination thereof.

* * * * *

UNITED STATES PATENT AND TRADEMARK OFFICE

CERTIFICATE OF CORRECTION

PATENT NO. : 6,515,367 B1
DATED : February 4, 2003
INVENTOR(S) : Bernard et al.

It is certified that error appears in the above-identified patent and that said Letters Patent is hereby corrected as shown below:

Column 2,
Line 35, delete “arid” and insert therefore -- and --

Column 6,
Line 41, delete “barier” and insert therefore -- barrier --
Line 45, delete “linig” and insert therefore -- lining --
Line 49, delete “combintion” and insert therefore -- combination --

Column 7,
Line 1, “integratd” and insert therefore -- integrated --
Line 5, delete “smiconductor” and insert therefore -- semiconductor --
Line 7, delete “barier” and insert therefore -- barrier --.
Line 22, delete “manufactuing” and insert therefore -- manufacturing --

Signed and Sealed this

Seventeenth Day of June, 2003

JAMES E. ROGAN
*Director of the United States Patent and Trademark Office*